United States Patent [19]

Fuller et al.

[11] Patent Number: 4,557,797

[45] Date of Patent: Dec. 10, 1985

[54] RESIST PROCESS USING ANTI-REFLECTIVE COATING

[75] Inventors: Gene E. Fuller, Richardson, Tex.; Yi-Ching Lin, Milipitas, Calif.

[73] Assignee: Texas Instruments Incorporated, Dallas, Tex.

[21] Appl. No.: 616,344

[22] Filed: Jun. 1, 1984

[51] Int. Cl.⁴ .................. B44C 1/22; C03C 15/00; C03C 25/06; C23F 1/02
[52] U.S. Cl. .................................. 156/643; 148/187; 156/652; 156/655; 156/656; 156/661.1; 156/904; 204/192 E; 427/43.1; 430/312; 430/318
[58] Field of Search ............... 430/312, 313, 318, 434, 430/329; 427/38, 39, 43.1, 54.1, 88–91; 156/643, 646, 668, 652, 655, 904, 656, 659.1, 661.1; 148/1.5, 187; 204/164, 192 E

[56] References Cited

U.S. PATENT DOCUMENTS

| | | | |
|---|---|---|---|
| 4,244,799 | 1/1981 | Fraser et al. | 156/656 X |
| 4,288,283 | 9/1981 | Umezaki et al. | 156/661.1 X |
| 4,341,850 | 7/1982 | Coane | 430/312 X |
| 4,370,405 | 1/1983 | O'Toole et al. | 430/312 |

Primary Examiner—William A. Powell
Attorney, Agent, or Firm—Melvin Sharp; Rhys Merrett; Robert Groover

[57] ABSTRACT

The present invention teaches a two-and-one-half-level resist process, wherein a first planarizing resist layer is applied, an anti-reflective coating (which need not be a photoresist itself) is applied, and then a top photoresist layer is applied. The top layer is patterned conventionally, at a wavelength which the anti-reflective coating absorbs, and a flood exposure (preferably in deep ultraviolet light) is then used to transfer this pattern to the bottom planarizing resist layer. Good patterning of non-planar surfaces despite topography is thus achieved, and pattern degradation due to spurious reflections (e.g., from an aluminum layer being patterned) is avoided.

61 Claims, 15 Drawing Figures

SESTERTIUS-LAYER RESIST PROCESS USING AR COATING

Fig.5a — 1.25 μm LINE/SPACE OVER ALUMINUM STEPS

Fig.5b — 0.8 μm LINE/SPACE OVER ALUMINUM STEPS

AR COATING AFTER ALUMINUM ETCH
Fig.6b

1 μm LINE/SPACE AFTER ALUMINUM ETCH
Fig.6a

Fig.7b

Fig.7a 0.8 μm LINE/SPACE OVER ALUMINUM STEPS AFTER PLASMA ETCH

RESIST PROCESS USING ANTI-REFLECTIVE COATING

BACKGROUND AND SUMMARY OF THE INVENTION

The present invention relates to patterning techniques in the fabrication of integrated circuit devices. In particular, the present invention relates to patterned etching techniques in the fabrication of integrated circuit devices. In particular, the present invention relates to methods of fabricating a patterned metal layer on top of a partially fabricated integrated circuit structure.

The conventional prior art of patterning integrated circuit structures uses a photoresist, i.e., a polymeric composition such that a developer solvent will selectively remove only the exposed (or, for different compositions, selectively only the unexposed) portions of the resist, leaving a patterned resist layer in place which provides a patterned mask for subsequent steps such as ion implementation, etching, or patterned deposition of materials by lift-off techniques (i.e., depositing a material over all and then removing the remaining portions of photoresist to leave the material only where the photoresist was not present).

However, this long established prior art patterning method has encountered substantial problems. First, difficulties arise in patterning the upper layers of the integrated circuit structure, where the patterns of the lower levels will provide substantial topography. Thus, a difficulty in metal patterning is typically the vertical excursion which can be substantial. That is, the metal will typically have to be patterned over a surface which is not flat but which may have a vertical variation of as much as a micron or two. This imposes great difficulties in focusing the optical pattern, since the vertical excursion may take portions of the surface out of the available depth of field. In the prior art, this difficulty has been avoided by using multi-layer resist processors. However, many multi-layer resist processes are difficult, unreliable, and more expensive.

Thus, it is an object of the present invention to provide an integrated circuit patterning method which can operate over non-planar topography at minimal expense and with minimal additional processing steps.

A further important limitation of prior art methods arises from pattern degradation due to reflection from the layer being patterned. For example, when a metal layer is being patterned, the places where the metal goes over a slope in the topography will induce lateral reflections of the incident exposing light. These may cause interference effects, or cause line width notching. In the prior art, use of dyed resists or anti-reflective coatings have been used in attempts to solve this problem. However, these efforts (where, e.g., an anti-reflective coating was deposited underneath the resist layer) still have their problems. The anti-reflective coating cannot achieve planarization, and thus the linewidth will still be modulated by the thickness variation in the top resist layer as it follows the topography. Alternatively, if the anti-reflective coating were deposited thickly enough to achieve planarization, then pattern degradation would occur as etching went through the patterned top resist layer through the (locally thick in some places) anti-reflective coating/planarization layer. No suitable materials are now known which can achieve anti-reflective absorption at a wavelength to which a top photoresist is sensitive, and provide planarization, and achieve good pattern transfer from the top layer.

Thus, it is an object of the present invention to suppress reflections from the substrate into the top resist layer, without degrading pattern transfer from the top resist layer.

It is a further object of the present invention to provide a method for integrated circuit patterning which both suppresses pattern degradation due to reflections from a substrate and also suppresses linewidth variation due to varying thickness of the top resist layer.

One major limitation in optical lithography is the resist linewidth variation across steps. This problem is more serious for a highly reflective substrate, and has been attributed to the non-uniform resist thickness near steps, which severely modulates the exposed energy coupled into the photoresist.

In the prior art, a bilayer resist process based on a conventional near-UV photoresist over PMMA structure has been used to improve the lithographic performance beyond the capability of a single layer resist process. See B. J. Lin, IEDM, San Francisco, CA, December 1982, which is hereby incorporated by reference. The thick PMMA layer is used to planarize the surface topography, so that a thin top imaging photoresist layer can be uniformly coated. This bilayer structure offers many attractive features. Better linewidth control can be obtained because of the planarization. The thin imaging layer also allows an improved resolution, a shorter exposure time, and a greater latitude for the depth of focus of the exposure system. High fidelity of pattern transfer from the top layer to the planarizing layer is achievable by deep UV flood exposure and then development of the bottom PMMA resist. Very sharp edge profiles in the PMMA layer result even if the top resist has an imperfect profile. This is because the deep UV light is absorbed strongly by the photoresist, and because very high selectivity of development between exposed and non-exposed PMMA is readily obtained.

However, there are still several drawbacks in implementing this bilayer resist process for production. See, C. H. Ting, I. Avigal, and B. C. Lu, Kodak Microelectronics Seminar, Interface '82, San Diego, CA, October, 1982, which is hereby incorporated by reference. For instance, there may exist a thin interface layer between the PMMA and the top resist, which can prevent uniform development of the PMMA. An extra stripping step before PMMA development either using dry descum or wet etch is required to give a more consistent clean development. The poor plasma etch resistance of PMMA, which is significantly worse than that of the Novolak-based resist materials, presents another disadvantage of the bilayer resist process. In addition, the nearly perfect transparency of PMMA in the near UV and visible wavelength ranges creates other problems in the bilayer resist structure. The standing wave effect is still present in the top layer photoresist, particularly if the substrate is highly reflective. Also, the light scattered from the wafer surface topography will degrade the pattern integrity of the top resist layer, and this problem is more severe when a thicker PMMA layer is used to accomplish better planarization; see, C. H. Ting, I. Avigal, and B. C. Lu, Kodak Microelectronics Seminar, Interface '82, San Diego, CA, October 1982, which is hereby incorporated by reference. It was reported by Bartlett, et al., that these reflective effects can be removed by adding absorbing dye into the PMMA; see K. Bartlett, G. Hillis, M. Chen, R. Trutna, and M. Watts, SPIE, Santa Clara, CA, March 1983, which is hereby incorporated by reference. However, the selection of the dye is very restricted, because the dye must be completely soluble into the PMMA, must be free from contamination, must strongly absorb the exposure light used for the top resist, must not degrade the alignment signal, and must not prevent Recently, a spun-on anti-reflective (AR) layer coated between a conventional resist and substrate has been shown to be effective in reducing the adverse effects of light reflection from the substrate; see, Y. C. Lin, A. J. Purdes, S. A. Saller, and W. R. Hunter, IEDM, San Francisco, CA, December 1982, wich is hereby incorporated by reference. This process is by no means perfect because it still suffers from resist thickness non-uniformity near topographical steps.

In the present invention, a new multi-layer resist process in which a thin AR film is introduced between the thick bottom PMMA layer and the thin top photoresist of the bilayer resist process is reported. This novel resist process has the ultimate advantages of planarization as well as anti-reflectivity for the top imaging resist layer. Most of the above mentioned problems associated with both the conventional bilayer resist process and the AR coating in single layer resist process are completely eliminated. Significant improvement in the lithographic performance for a conventional reduction projection printer has been achieved with this new process.

The new multi-layer resist process, wherein a thin antireflective (AR) film is provided in addition to between the thick bottom PMMA layer and the top photoresist layer of the conventional bilayer resist process, has provided aluminum features of micron and submicron size over topography, using a conventional 10:1 reduction GCA DWS 4800 stepper to expose the top photoresist layer. Excellent linewidth control over steps is demonstrated. Both the standing wave effect in the top resist layer and the interference from the light scattered by the substrate topography are eliminated in this AR coating approach. The interface layer problem encountered in the original bilayer resist process does not appear in this new process. The plasma etch resistance of this new multi-layer resist process is improved by retaining the capping top photoresist layer, which also eliminates the delamination of the AR layer. This novel resist process provides a low-cost, reliable method for further extending the resolution capability of existing steppers to meet the needs of advanced product designs.

According to the present invention there is provided:
an integrated circuit patterning process comprising the steps of:
providing a substrate having partially formed integrated circuit structures on the top surface thereof;
depositing a first photoresist material over the top surface of said substrate, said first photoresist material being deposited to provide a substantially planar surface;
depositing an anti-reflective coating over said first photoresist material; and
depositing a second photoresist material over said anti-reflective material; and
exposing said second photoresist material to patterned optical illumination in a predetermined pattern.
According to the present invention there is provided:
an integrated circuit metallization process comprising the steps of:
providing a substrate having partially formed integrated circuit structures on the top surface thereof;
etching contact holes in predetermined locations;
depositing a thin film of a metal overall on said top surface;
depositing a first photoresist material over said metal film, said first photoresist material being deposited to provide a substantially planar surface;
depositing an anti-reflective coating over said firt photoresist material; and
depositing a second photoresist material over said anti-reflective material;
wherein said first photoresist material is photosensitive at a first wavelength to which said second photoresist material is opaque,
and wherein said anti-reflective material is opaque at a second wvelength to which said second photoresist layer is sensitive;
exposing said second photoresist material to patterned optical illumination at said second wavelength in a predetermined pattern;
developing said second photoresist material, so that said second photoresist material is removed in areas determined by said predetermined pattern;
illuminating said first photoresist material at said first wavelength;
developing said first photoresist; and
exposing said integrated circuit structure to a predetermined metal etchant, whereby portions of said metal film exposed by said first photoresist layer are etched and portions of said metal film which are overlaid by remaining portions of said first photoresist layer are not substantially etched.

BRIEF DESCRIPTION OF THE DRAWINGS

The present invention will be described with reference to the accompanying drawings, wherein.

DESCRIPTION OF THE PREFERRED EMBODIMENTS

Implementation details of this novel resist process are similar in many ways to conventional bilayer resist procedure. The only steps added are spin coating and bake of a thin AR layer after the curing of the PMMA and before the coating of the 600 nm top photoresist layer. This AR coating can be applied, patterned, developed, and stripped with the photoresist. The thickness of this AR layer can range from 200 nm to 500 nm. The planarizing layer preferably used is KTI 9% PMMA with 496000 molecular weight and the top photoresist layer is preferably Shipley Microposit 1400-17 (basically a Novolak resin, i.e., a phenol or cresol formaldehyde resin, with a photosensitizer such as 2-diazo-1-axomaphthalene and a ballast of diazooxide moiety. The developer used with this is preferably tetramethyl ammonium hydroxide). The PMMA and the 1400-17 resist are baked in air convection ovens at 190° C. for 1 hour and at 100° C. for 30 minutes, respectively. The baking conditions for the AR layer are more critical, since they influence the undercutting in the AR layer during resist development. Zero undercut can be obtained using narrow range of bake temperatures appropriate to the particular AR coating material. Optical exposure of the photoresist is then conducted using a 10:1 reduction GCA DSW 4800 stepper. Metal-ion-free developer (Shipley MF-312 or MF-314 diluted 1 to 1 with D.I. water) is used to simultaneously develop the top resist and the underlying AR layer. Because the AR layer does not require an extra etching step, its role is considered a only a half layer. The term "sestertius (two and a half) layer resist" is thus used to describe this new process.

There is no interface layer problem with this novel resist process. This is because the photoresist is separated from the PMMA layer, and the properly baked AR film does not interact with the PMMA or photoresist at all. Therefore, with no need for any additional treatment following the conventional top layer resist development, the PMMA is now ready for deep UV exposure and development. Deep UV light generated from an arc lamp is used to expose the PMMA layer.

Two types of developers have been investigated for developing the PMMA after deep UV exposure, namely, methyl ethyl ketone (MEK), which removes the top resist layer, and chlorobenzene, which allows the top resist layer to remain in place after development. Because delamination of the AR layer is occasionally observed with the MEK developer, chlorobenzene is preferred for this new resist process. This gives a capped resist structure which provides additional plasma etch resistance during pattern transfer into the substrate. Plasma etch of submicron features in aluminum has been achieved with this capped resist structure using a Cl-based chemistry. After the plasma etch, the resist can be either ashed in-situ in the reactor or removed with a conventional resist stripper.

Figure 1:
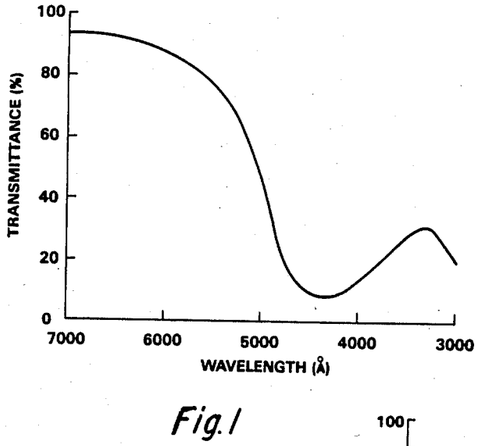
FIG. 1 shows a transmission spectrum of a 200 nm AF film.

FIG. 1 shows the transmission spectrum of a 200 nm AR film. It is evident that the film effectively absorbs 90% of the exposing light of 436 nm wavelength. The amount of light reflected from the AR film back into the photoresist is thus very small, and the standing wave effect in the imaging layer is eliminated. On the other hand, the AR film is almost transparent for light with a wavelength longer than 550 nm. Therefore, there is no degradation of the alignment signal caused by this AR film if the wafer is aligned using yellow or red light.

Figure 2:
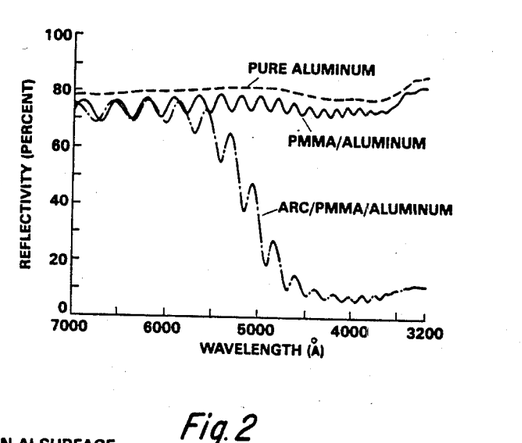
FIG. 2 shows a reflectivity spectrum for (a) pure aluminum surface, (b) 3 micron PMMA coated over pure aluminum, and (c) 200 nm AR coating over the structure given in (b).

Another difficulty in the conventional bilayer resist process is that the pattern integrity in the imaging photoresist layer is degraded by the light scattered from the wafer topography beneath the PMMA. FIG. 2 compares the reflectivity from three types of substrate surfaces, namely, pure aluminum, PMMA coated aluminum, and AR coating on the PMMA/aluminum, and it remains around 75% for PMMA-coated surfaces. Thicker PMMA layers do not significantly attenuate the reflected light, since similar reflectivity has been observed for various PMMA thicknesses, ranging from 1 um to 5 um. However, the addition of an AR layer can drastically reduce the reflectivity to less than 10% at the exposure wavelength of 436 nm. This indicates that the light scattered from the substrate topography is suppressed significantly before it reaches the imaging photoresist. Therefore, the AR coating substantially improves the patterns in the imaging layer by eliminating both the standing wave effect in the top resist layer and the interferences by the light scattered from underlying topography.

Figure 3A:
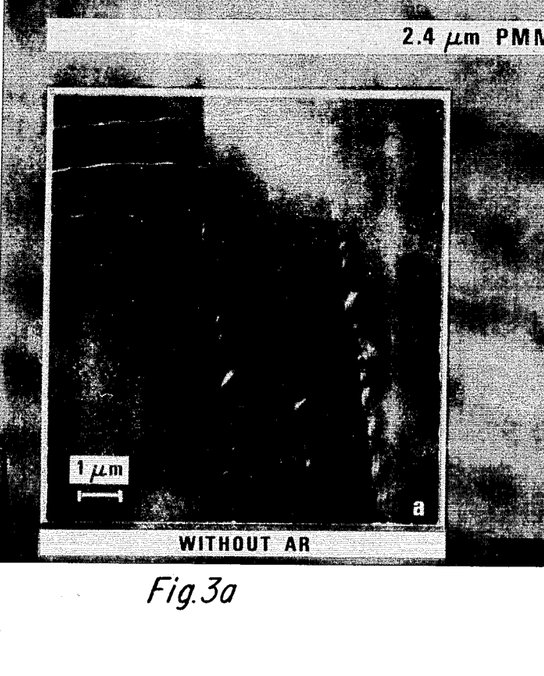
FIG. 3 shows a resist pattern of 0.8 um line/space in the top layer photoresist on pure aluminum surface. (a) for the case without AR coating (b) for the case with AR coating.
Figure 3B:
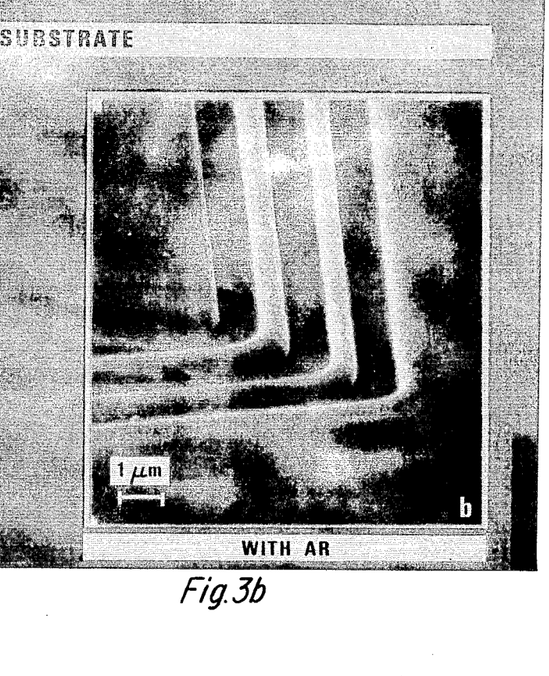

FIG. 3 illustrates 0.81 um line/space patterns in the top photoresist on pure aluminum surfaces using the bilayer (a) and the sestertius-layer (b) resist processes, respectively. The standing wave effect observed for the case without AR coating (a) does not appear for the case with AR coating (b). It is also apparent that the pattern integrity in case (b) is superior to that in case (a). Much better linewidth control can be obtained with the AR coating in the sestertius-layer resist process.

Figure 4:
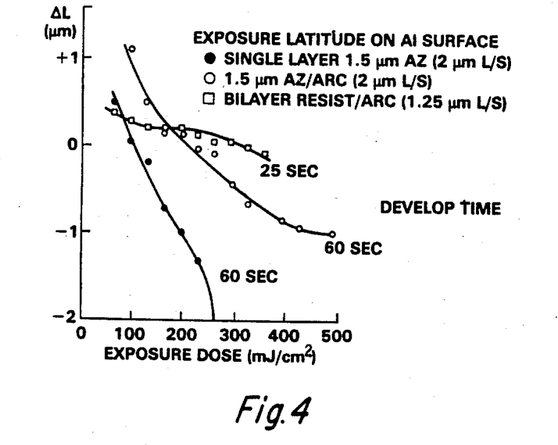
FIG. 4 shows a linewidth deviation versus exposure dose for (a) 1.5 um photoresist and (b) AR coating under 1.5 um photoresist. The nominal linewidth for these two cases is 2 um, and 60 sec development time is used. (c) present sestertius-layer resist process, where nominal linewidth is 1.25 82 m and 25 sec development time is used. The photoresist used in all cases is Shipley Microposit resist.

The exposure latitude is also extended by the AR coating. This is depicted in FIG. 4, where the resultant liewidth deviation from its nominal size is given as a function of the exposure dose for three cases: single-layer resist process using 1.5 um photoresist, AR coating under the 1.5 um resist, and the present process. A shorter development time (24 sec) is used for the thinner top resist in the sestertius-layer resist process, in comparison with the 60 sec time used for the other two processes. It is obvious that the present process has the greatest exposure latitude. The linewidth variation sensitivity with respect to changes in exposure dose is also reduced significantly if the AR layer is applied. Note that a conventional bilayer resist process without the AR coating will have a similar limited latitude comparable to that for the single-layer resist process.

Figure 5A:
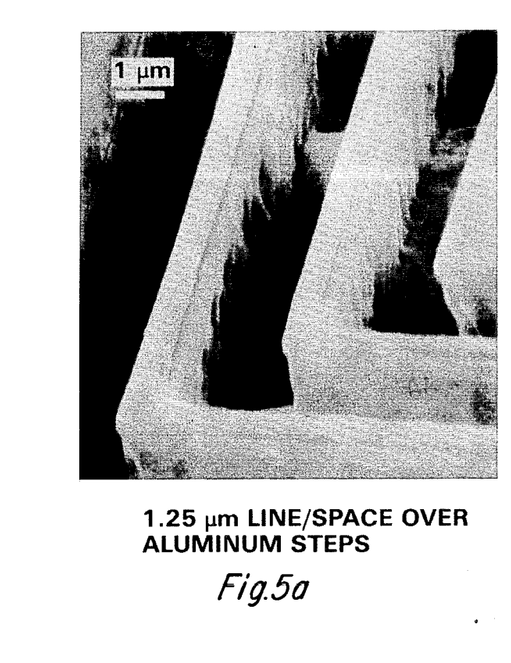
FIG. 5 shows resist patterns after being transferred into the bottom PMMA layer using the sestertius-layer resist process. Both 1.25 and 08 um lines/spaces are shown.
Figure 5B:
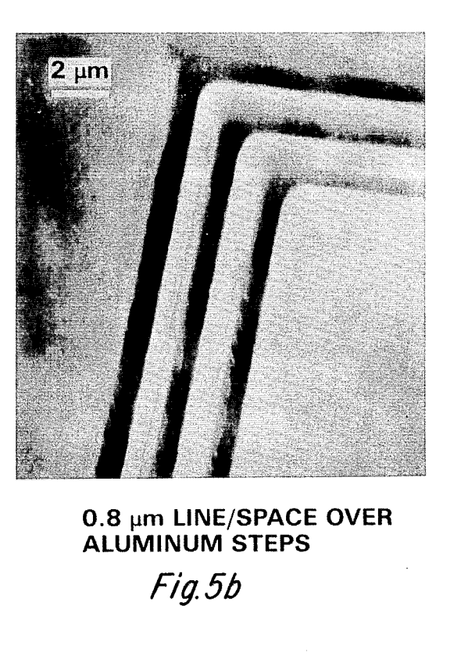

SEM micrographs in FIG. 5 show the resist patterns after being transferred into the thick PMMA bottom layer. The substrate is aluminum over 0.5 um topography resulting polysilicon gate patterning. Both the 1.25 um line/space patterns (a) and the 0.8 um line/space patterns (b) are over steps, although the steps in FIG. 5(b) are only barely visible because the secondary electrons from the aluminum surface in the deep 0.8 um spaces are largely blocked by the thick PMMA layer. There is no adverse undercutting due to the AR layer during the PMMA development, and the pattern retains full integrity in the thick PMMA layer.

Figure 6A:
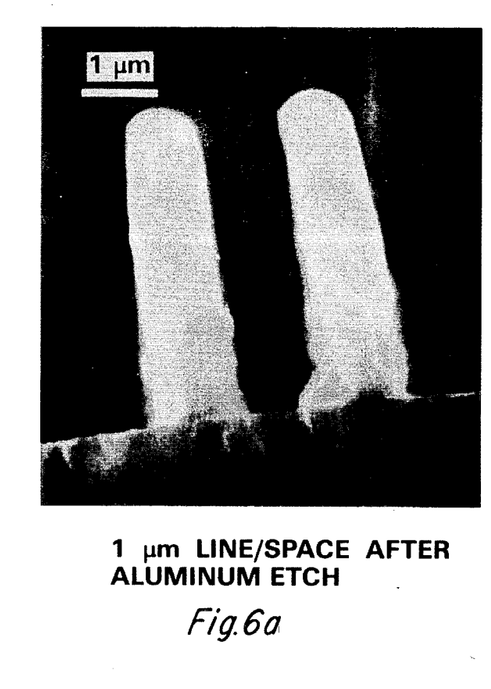
FIG. 6 shows a cross section of sestertius-layer resist structure after plasma aluminum etch. (a) pattern of 1 um line/space, and (b) AR coating between the top layer photoresist and the bottom layer PMMA.
Figure 6B:
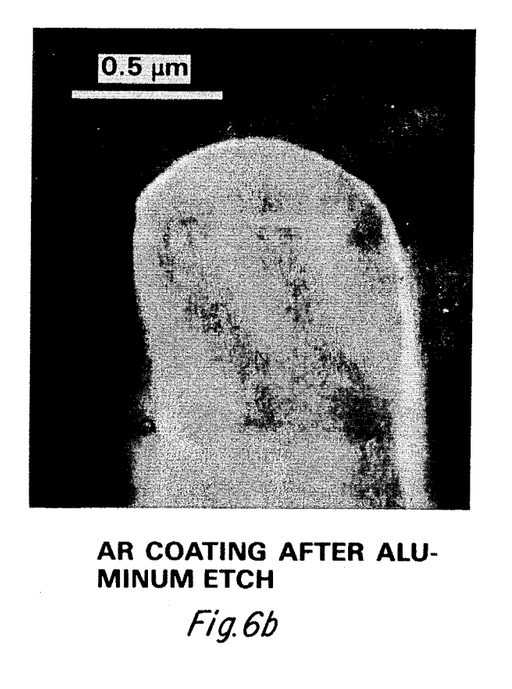

However, the capability to transfer the resist pattern into the substrate, which is usually realized by plasma etching, is the ultimate goal of the lithography process. A cross-section of 1 um line/space patterns after a plasma etch of the 1.2 um thick aluminum is shown in FIG. 6(a). With the capped resist structure, the PMMA is not eroded during the plasma etch, and vertical PMMA sidewalls with high aspect ratios are retained to assure faithful pattern transfer into the substrate. A close-up of the AR layer after plasma etch is shown in FIG. 6(b). Again, there is no detrimental undercutting due to the AR film.

Figure 7A:
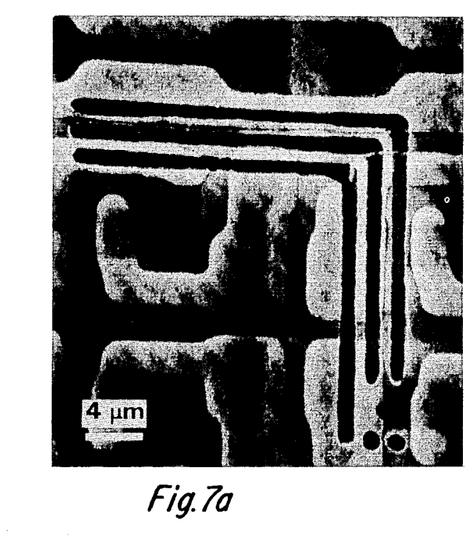
FIG. 7 shows patterns of 0.8 micron aluminum line/space over 0.5 micron topography. The resists have been removed after plasma aluminum etch.
Figure 7B:
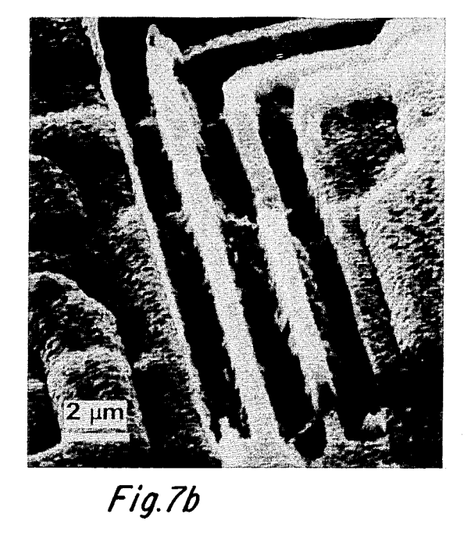

The 0.8 um aluminum lines from the etched sample after removing the covering resists are shown in FIG. 7. These lines are arbitrarily positioned over the steps, with no intention of any alignment, to illustrate the excellent linewidth control over topography. The micrographs clearly demonstrate that superior pattern fidelity of the resultant aluminum features in the micron and submicron ranges can be achieved with this novel sestertius-layer resist process.

THus, the sestertius-layer resist process of the present invention differs from a bilayer resist process by introducing a thin AR film between the bottom PMMA layer and the top photoresist layer. Both the standing wave effect in the imaging photoresist and the interference by the light scattered from the substrate topography are eliminated. This novel AR coating approach allows excellent patterns to be achieved in the micron and submicron ranges over aluminum steps using a conventional 10:1 reduction GCA DSW 4800 projection stepper to expose the top resist layer. The interface layer problem in the regular bilayer resist process is also eliminated because the AR coating does not interact with either the PMMA or the conventional positive photoresist. The plasma etch resistance of the sestertius-layer resist is improved by retaining the top resist layer as a capping structure, which also eliminates the potential delamination problem of the AR layer. In addition, excellent linewidth control and better exposure latitude are obtained with this AR coated process. The processing of the spun-on AR material is very simple and convenient. It can be applied, patterned, developed, and stripped with the photoresist. The only steps added to the bilayer resist process are the coating and baking of the AR film. This novel sestertius-layer resist process offers a low-cost, reliable method for further extending the resolution capability of existing steppers to meet the needs of advanced product designs.

The spin-on AR material is basically light-absorbing dye dissolved in a polyimide silane type resin available as "ARL" from Brewer Science. An alternative material is "ARPN" from Brewer Science. The light absorption characteristics may deteriorate if the dye degrades, for example by baking in oxygen environment. The extinction coefficient of 436 nm light in a 200 nm AR film may vary from 0.46 following a 148° C. bake to 0.36 after a 170° C. bake.

The bake temperature can affect the light absorption property due to the AR film, as discussed above. But the variation of the k value due to bake temperature has insignificant impact on the resist patterning if the bake temperature is controlled within $+/-2°$ C. However, the bake temperature can affect the development rate of the AR film in the photoresist developer considerably. This is because the development of the AR film is controlled by the polymer crosslinking, which is strongly temperature dependent factor.

Figure 8:
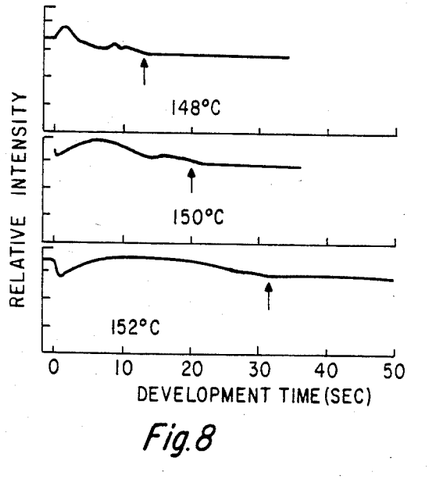
FIG. 8 shows typical traces for the development of AR films. The developer in this case is a 1:2 dilution of MF-312 in water. The AR films were coated on Si surface and then baked for 30 minutes in (a) 148° C., (b) 150° C., and (c) 152° C. The arrows indicate the endpoints of the development.
Figure 9:
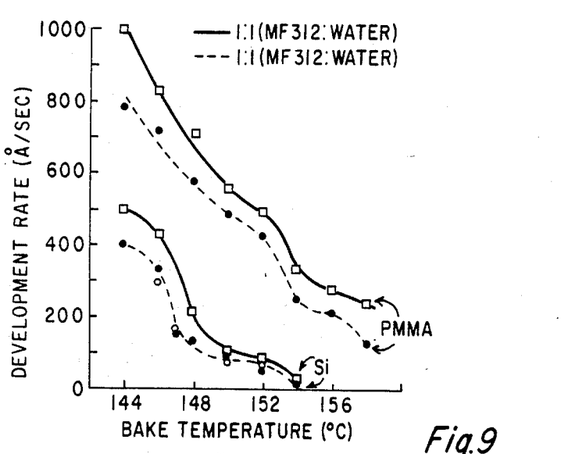
FIG. 9 shows AR film development rate versus bake temperature for AR coated on Si and PMMA surfaces. Results from two dilutions of MF-312 developer were shown. The solid curves are for 1:1 dilution, and the dotted curves for 1:2 dilution.

Shipley metal-ion-free developer MF-312 was used in sample embodiments with two concentrations, 1:1 and 1:2 diluted in D. I. water. The development rate of the AR film was monitored in situ with a laser interferometry measurement. FIG. 8 shows typical recorded signals for a 200 nm thick AR film coated on a Si wafer in a 1:2 diluted MF-312 developer. In FIG. 6, three bake temperatures were used for the AR films, which were baked in an air convection oven for 30 minutes. It can be seen that a longer development time is required to completely remove the AR film baked at higher temperatures. FIG. 9 summarizes the measured development rate for AR film on two surfaces, namely, PMMA and Si. Development results for both 1:2 and 1:1 concentrations are given. As expected, the development rate decreases as the bake temperature increases, and the rate is higher for more concentrated developer. In general, the 1:1 concentration gives a rate about 15% to 25% greater than the 1:2 concentration. It is seen that the rate for AR film on PMMA is much faster than that for AR film on a Si surface. This may be caused by the interaction of the PMMA solvent with the AR film. However, the intermediate layer problem in the bilayer resist process has not been observed in the sestertius-layer structure. The development rates for AR film on other surfaces such as nitride, aluminum, thermal oxide, and spin-on oxide glass have also been measured, and they are all similar to the rate for AR film on a Si surface.

It is worthwhile to note that the exposure of the AR film to the 436 nm light does not change the development rate in a noticeable way.

The development rate is less sensitive to bake temperature in the range of 148° C. to 150° C. for AR coated on Si surface. However, an appropriate bake temperature should give an adequate AR development rate to ensure a clean removal of the AR film in the development step. A rough resist line edge may result from incomplete removal of AR film caused by overbaking. On the other hand, underbake may result in severe undercut in the AR film, which leads to undesired lifting of the resist patterns.

The bake temperature can influence the exposure latitude. The change of linewidth with respect to the exposure does follows the same curve for various bake temperatures investigated. The difference made by the bake temperature is that at lower bake temperature, the resist patterns is more likely to lift off due to AR undercutting. This is indicated by the dashed line in the figure. Basically, a high bake temperature prvents resist liftoff, and gives wide exposure latitude. But too high a temperature is not desirable because of AR residual.

Figure 10:
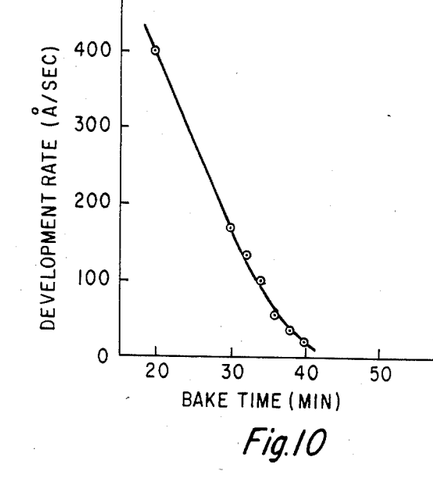
FIG. 10 shows AR development rate as a function of the bake time in a 147° C. oven. The developer is 1:2 diluted MF-312.

The bake time is also a critical parameter in the air convection oven bake. FIG. 10 depicts the development rate as a function of the bake time for a 147° C. bake temperature. For a 30 minute bake, the change of the development rate with respect to the bake time is about 2 angstroms/second per minute change in bake, which is a 14% variation in the development rate.

Since both temperature and time in he baking step are critical to the AR film, the control of the oven operation becomes a significant factor to maintain a reproducible process. Our experimental results indicate that a maximum loading time of 5 seconds is required, and even in this case, it may give as much as +/−8% variation in the development rate.

The development process also plays an important role in controlling the AR process. As already pointed out in FIG. 9, the AR development rate depends on the developer concentration. Dilution of the developer will reduce the AR development rate. This allows a more manageable development time control to avoid severe undercut in AR film. Indeed, the development time is an important process parameter. After the resist is cleared, the developer reaches the AR film and starts to etch the AR film vertically and laterally. Experimental results show that the lateral development rate is equal to the vertical development rate within measurement error. This indicates that the development of AR film is an isotropic etching process.

Figure 11:
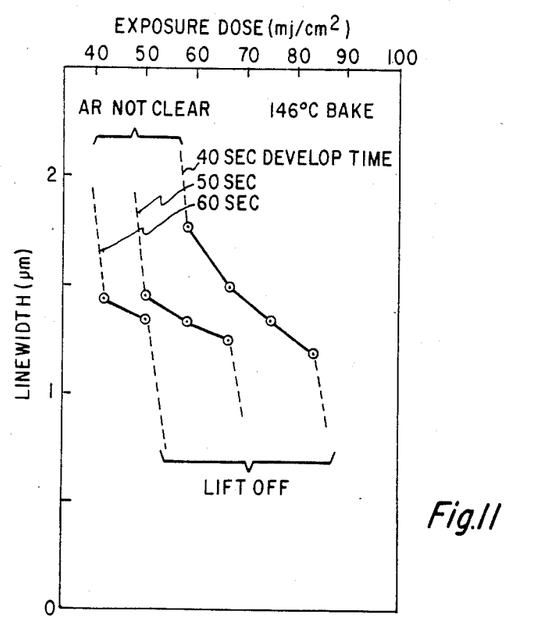
FIG. 11 shows exposure latitude for resist process using AR coating. The AR film was baked at 146° C. for 30 minutes. The resist was immersion developed in 1:1 diluted MF-312 for 40, 50, and 60 sec, respectively.

The longer the development time used, the more the developer will attack the AR film, and the greater the AR undercuts. A short development time will provide wide exposure latitude without severe AR undercut. This is illustrated in FIG. 11, where linewidth versus exposure does are shown for various development times for resist on 146° C. baked AR film. Over-exposed resist will be cleared in a short time, and allow more access of developer to the AR film. Liftoff in the resist pattern is thus more apt to occur for an over-exposed condition. This limits the exposure latitude for the AR process in comparison with the case without AR coating.

The development rate of the AR coating is the most critical parameter to consider in order to optimize the AR process. The rate can be controlled by bake conditions as well as developer concentration. However, the rte is not affected by the exposure of the AR film to the g-line light. The bake temperature and time must be optimized. An over-bake condition gives a residual of AR film that cannot be removed, and rough pattern edges will degrade linewidth control. In contrast, an under-bake condition gives undercut in the AR film and the resist pattern will lift off. Characterization of the bake process is important to achieve a reproducible process. Tight control of oven temperature within +/−2° C. is necessary, and the time used to load wafers into the air convection oven should be minimized. Precise control of the total bake time is also required.

Dilution of the developer decreases the AR development rate. A short development time cuts down the acces of developer to the AR film. Both reduce the possibility of AR undercut and resist liftwoff. They also lead to a greater exposure latitude. However, this is achieved only at the expense of throughput, because over-exposure of the resist is required to increase the resist development rate for the short development in a diluted developer.

The strong absorption of the AR film at g-line alleviates any stringent requirment in the film coating uniformity. For a specific multilayer resist structure, the AR film thickness can be optimized to minimize the reflectivity as well as to eliminate the effect of bake degradatin of the AR absorbance.

In summary, an appropriate AR development rate must be first determined for a specific process. The controllability of the bake conditions must be taken into consideration in this decision. A diluted developer to give the desired development rate of the AR film is preferred, providing the contrast of such developer is high enough to give appropriate resist profiles. A short development time that is adequate to cleanly remove the AR film should be used to gain the exposure latitude. Since the exposure dose can be controlled very accurately on today's steppers, reproducible linewidth control using an AR process can be achieved with a wide exposure latitude, which allows precise resist sizing control. Optimization of the resist process with AR coating will further extend the capability for existing exposure tools.

The preferred embodiments of the present invention have been extensively discussed above, but the present invention can be practiced with a wide range of other material. The requirements and preferable elements to consider in selecting alternative materials with which to practice the present invention are the following:

The first photoresist material should preferably be spin-coatable, preferably to a thickness in the range of one to five microns thick, preferably to a thickness which is generally uniform across the slice and planarizes the topography at least to some extent. Second, it should be preferably possible to further planarize the first photoresist layer, e.g. by baking it at a modest temperature such as 275° C. Third, the first photoresist material must be photosensitive to some wavelength where the second photoresist material is opaque. In the range of embodiments preferably contemplated by the present invention, this will be at deep ultraviolet wavelengths of 265 nanometers or shorter. However, it is not necessary that this wavelength be in the range between 185 and 265 as presently used. For example, with other material systems it is alternatively possible to use vacuum ultraviolet wavelengths, i.e., below 185 nanometers for this flood exposure. In alternative chemical systems, it may also be possible to use longer wavelengths. The key limitation is simply that the first photoresist material must be photosensitive to some wavelength or range of wavelengths at which the top photoresist is opaque. Fourth, it is preferable, although not necessary, that the first photoresist material should be able to provide etch resistance for plasma etching. As is well known in the plasma etching art, control of etching is much easier where resist erosion during the etch process is minimized. Fifth, it is preferable, although not necessary, that the first photoresist material be capable of development in a solvent which will not erode the top layer. This provides the advantage that a capped resist structure remains in place, so that the remaining portions of the second photoresist material will provide some further patterned resistance to subsequent processing steps such as plasma etching. Sixth, it is necessary that the first photoresist material not be eroded in some set of conditions which are capable of developing the second photoresist material.

The key requirements and preferable requirements of the intermediate anti-reflective coating layer are: first, that it be opaque to some wavelength to which the second photoresist material is photosensitive. In the presently preferred embodiment, this is a range of wavelengths in the neighborhood of 436 nanometers, but, of course, this could be widely varied at will. Second, the anti-reflective coating must be uniformly coatable, preferably to a film thickness below 2,000 angstroms. If the anti-reflective coating is too thick, the pattern may be slightly degraded, and the anti-reflective coating may be undercut substantially during the steps which develop the second photoresist material. Third, the anti-reflective coating should preferably be removable in the developer which develops the second photoresist material. As extensively discussed above, the bake time used for the anti-reflective coating can be controlled to control the rate at which the anti-reflective coating is removed during this etching step. Fourth, an important requirement is that the anti-reflective coating must be capable of adhesion to the first photoresist material, and the second photoresist material must be capable of adhesion to the anti-reflective coating. Sixth, a related preferable requirement is that the anti-reflective coating should not react with the first photoresist material to form any substantial thickness of insoluable or opaque material, nor should the second photoresist material react with the anti-reflective coating to form any substantial thickness of insoluable or opaque material. Seventh, it is preferable, although not necessary, that the anti-reflective coating be removable. This affords greater processing convenience, in contrast to some prior art methods which have used a hard masking layer for pattern transfer as a middle layer in a three-layer process.

The requirements and preferable elements of the second photoresist material are that it be uniformly coatable, preferably thinly, e.g. to a thickness of less than one micron, for best geometry and pattern sensitivity. Second, the second photoresist material must, of course, be photosensitive. Third, this second photoresist material must be developable. A fourth preferable element, which is not necessary, is that, to permit rework, it should be possible to selectively remove the second photoresist material without removing the first photoresist material. Fifth, as noted, the second photoresist material must be opaque at some wavelength to which the first photoresist material is photosensitive.

Thus, the overall sequence of steps used in the presently preferred embodiment are: a first photoresist material is coated and baked at a low temperature to planarize it. An anti-reflective coating is spin-coated and baked to cure it. A top photoresist layer is then uniformly coated, soft baked, and exposed at 436 nanometers, at an energy density in the range of 70 to 100 milliJoules per $cm^2$ over a time of about 0.2 to 0.5 seconds with the desired pattern. This layer is developed by immersion in MF-312 (tetramethyl ammonium hydroxide). This development step also removes portions of the anti-reflective coating which are accessible, i.e., which underlie areas of the top resist which were illuminated during the pattern exposure are therefore also being removed. At this time the anti-reflective coating will also typically undercut the unexposed portions of the second photoresist material to a slight extent. The structure is then flood illuminated with an energy density in the approximate neighborhood of one Joules per square centimeter over a time ranging between several seconds to several minutes, with wavelengths in the approximate range from 185 to 265 nm. Longer wavelengths could be used, but it has been found that too high an energy density at longer wavelengths will produce undesirable effects in the second photoresist material, in the presently preferred embodiment. The short wavelength cutoff at 185 is simply imposed by atmospheric absorption, but shorter wavelengths would serve perfectly well to expose the first photoresist material, aside from the difficulty of transferring them through an atmosphere. After this flood exposure, the first photoresist material is then developed in monochlorobenzene spray. The result of these steps is a capped resist structure. In a sample embodiment, where aluminum is being patterned, a layer of aluminum, previous to these patterning steps, will have been sputter deposited over an interlevel dielectric in which profiled contact holes have been cut and shaped. After the above-described patterning steps, the aluminum will be plasma etched in an atmosphere such as chlorine plus silicon tetrachloride, until the AlCl lines are no longer detected in the plasma emission. The resist structure is then stripped, e.g., in an oxygen plasma, and a fully patterned metalization layer has then been formed, and the integrated circuit structure can then proceed to the next stage of processing, if further processing is required.

The present invention is particularly useful, not merely for aluminum patterning, but for metal patterning in general, where similar problems of pattern degradation due to substrate reflection exist. For example, the present invention is also particularly useful for patterning molybdenum. In this case, a fluorine based plasma etching chemistry would preferably be used.

The process as described is most particularly useful for patterning the upper layers in an integrated circuit structure, especially the metal layers, but it is also useful for patterning all other layers, gates, source drains, contacts, etc.

Thus, the inventive process as described and claimed herein achieves the above-named objects of the invention, as well as other advantages. In particular, the present invention advantageously provides that the top photoresist layer, which is the layer which is initially patterned, is not only planar but also has a uniform thickness. Thus, the linewidth will not be modulated by the thickness of the resist being exposed, which can happen in prior art methods where a non-uniform resist thickness results from the topography of the layers being exposed.

The present invention advantageously provides an integrated circuit patterning method which can operate over non-planar topography at minimal expense and with minimal additional processing steps.

The present invention advantageously provides suppression of reflections from the substrate into the top resist layer, without degrading pattern transfer from the top resist layer.

The present invention advantageously provides a method for integrated circuit patterning which both suppresses pattern degradation due to reflections from a substrate and also suppresses linewidth variation due to varying thickness of the top resist layer.

As will be obvious to those skilled in the art, the present invention can be practiced in a wide range of modifications and variations, and is not limited except as specified in the accompanying claims.

What is claimed is:

1. An integrated circuit patterning process comprising the steps of:
   providing a substrate having partially formed integrated circuit structures on the top surface thereof;
   depositing a first photoresist material over the top surface of said substrate, said first photoresist material being deposited to provide a substantially planar surface;
   depositing an anti-reflective coating over said first photoresist material; and
   depositing a second photoresist material over said anti-reflective material;

and exposing said second photoresist material to patterned optical illumination in a predetermined pattern.

2. The process of claim 1,
wherein said first photoresist material is photosensitive at a first wavelength to which said second photoresist material is opaque,
and wherein said anti-reflective material is opaque at a second wavelength to which said second photoresist layer is sensitive.

3. The process of claim 1, wherein said first photoresist material consists essentially of PMMA (polymethylmethacrylate).

4. The process of claim 2, further comprising the subsequent step of:
exposing said second photoresist material to patterned optical illumination at said second wavelength in a predetermined pattern;
developing said second photoresist material, so that said second photoresist material is removed in areas determined by said predetermined pattern;
illuminating said first photoresist material at said first wavelength; and
developing said first photoresist.

5. The process of claim 4,
wherein said step of developing said second photoresist material also removes accessible portions of said anti-reflective material.

6. The process of claim 1, wherein said anti-reflective coating does not react with said first or second photoresist materials to form an insoluble or opaque additional layer.

7. The process of claim 1, wherein said anti-reflective coating is adherent to said first photoresist material, and said second photoresist material is adherent to said anti-reflective coating.

8. The process of claim 1, wherein said first and second photoresist materials have respective compositions such that said second photoresist material can be developed in a solvent which will not erode said first photoresist material.

9. The process of claim 1, wherein said first and second photoresist materials have respective compositions such that said first photoresist material can be developed in a solvent which will not erode said second photoresist material.

10. The process of claim 9, wherein said first and second photoresist materials have respective compositions such that said first photoresist material can be developed in a solvent which will not erode said second photoresist material.

11. The process of claim 2, wherein said first wavelength comprises a wavelength shorter than 300 nm.

12. The process of claim 2, wherein said second wavelength comprises a wavelength longer than 300 nm.

13. The process of claim 2, wherein said anti-reflective coating is deposited to a substantially uniform thickness between 1000 and 2500 Angstroms.

14. The process of claim 1, wherein said first photoresist material is deposited to a minimum thickness in the range between 0.5 and 5 microns.

15. The process of claim 1, wherein said second photoresist material is deposited to a substantially uniform thickness of less than 1 micron.

16. The process of claim 1, further comprising the additional step, before deposition of said anti-reflective coating, of baking said first photoresist material at a temperature below 300 C., whereby said first photoresist material is further planarized.

17. The process of claim 1, wherein said anti-reflective coating and said first photoresist material have respective compositions such that said anti-reflective coating is removable under conditions which will not remove said first photoresist material.

18. The process of claim 1, wherein said second and first photoresist materials have respective compositions such that said second photoresist material is removable under conditions which will not remove said first photoresist material.

19. The process of claim 1, wherein said anti-reflective photoresist material is removable under conditions which will also develop said second photoresist material.

20. An integrated circuit selective etching process comprising the steps of:
providing a substrate having partially formed integrated circuit structures on the top surface thereof;
depositing a first photoresist material over the top surface of said substrate, said first photoresist material being deposited to provide a substantially planar surface;
depositing an anti-reflective coating over said first photoresist material; and
depositing a second photoresist material over said anti-reflective material;
wherein said first photoresist material is photosensitive at a first wavelength to which said second photoresist material is opaque,
and wherein said anti-reflective material is opaque at a second wavelength to which said second photoresist layer is sensitive;
exposing said second photoresist material to patterned optical illumination at said second wavelength in a predetermined pattern;
developing said second photoresist material, so that said second photoresist material is removed in areas determined by said predetermined pattern;
illuminating said first photoresist material at said first wavelength;
developing said first photoresist; and
exposing said integrated circuit structure to a predetermined etchant, whereby portions of said top layer exposed by said first photoresist layer are etched and portions of said top layer which are overlaid by remaining portions of said first photoresist layer are not substantially etched.

21. The process of claim 20, wherein said first photoresist material is resistant to said predetermined etchant.

22. The process of claim 20, wherein said second photoresist material is resistant to said predetermined etchant.

23. The process of claim 21, wherein said second photoresist material is resistant to said predetermined etchant.

24. The process of claim 20, wherein said anti-reflective coating does not react with said first or second photoresist materials to form an insoluble or opaque additional layer.

25. The process of claim 20, wherein said anti-reflective coating is adherent to said first photoresist material, and said second photoresist material is adherent to said anti-reflective coating.

26. The process of claim 20, wherein said first and second photoresist materials have respective compositions such that said second photoresist material can be developed in a solvent which will not erode said first photoresist material.

27. The process of claim 20, wherein said first and second photoresist materials have respective compositions such that said first photoresist material can be developed in a solvent which will not erode said second photoresist material.

28. The process of claim 20, wherein said first wavelength comprises a wavelength shorter than 290 nm.

29. The process of claim 20, wherein said second wavelength comprises a wavelength longer than 290 nm.

30. The process of claim 20, wherein said anti-reflective coating is deposited to a substantially uniform thickness between 800 and 2500 Angstroms.

31. The process of claim 20, wherein said first photoresist material is deposited to a minimum thickness in the range between 0.4 and 5 microns.

32. The process of claim 20, wherein said second photoresist material is deposited to a substantially uniform thickness of less than 0.8 micron.

33. The process of claim 20, further comprising the additional step, before deposition of said anti-reflective coating, of baking said first photoresist material at a temperature in the range between 260 and 290 C., whereby said first photoresist material is further planarized.

34. The process of claim 20, wherein said anti-reflective coating and said first photoresist material have respective compositions such that said anti-reflective coating is removable under conditions which will not remove said first photoresist material.

35. The process of claim 20, wherein said second and first photoresist materials have respective compositions such that said second photoresist material is removable under conditions which will not remove said first photoresist material.

36. The process of claim 20, wherein said anti-reflective photoresist material is removable under conditions which will also develop said second photoresist material.

37. An integrated circuit selective lift-off deposition process comprising the steps of:
    providing a substrate having partially formed integrated circuit structures on the top surface thereof;
    depositing a first photoresist material over the top surface of said substrate, said first photoresist material being deposited to provide a substantially planar surface;
    depositing an anti-reflective coating over said first photoresist material; and
    depositing a second photoresist material over said anti-reflective material;
    wherein said first photoresist material is photosensitive at a first wavelength to which said second photoresist material is opaque,
    and wherein said anti-reflective material is opaque at a second wavelength to which said second photoresist layer is sensitive;
    exposing said second photoresist material to patterned optical illumination at said second wavelength in a predetermined pattern;
    developing said second photoresist material, so that said second photoresist material is removed in areas determined by said predetermined pattern;
    illuminating said first photoresist material at said first wavelength;
    developing said first photoresist;
    depositing a thin film of a predetermined material overall; and
    removing remaining portions of said photoresist layers, whereby said predetermined material remains on portions of said top layer which had been exposed by said developed first photoresist layer in said predetermined pattern and does not substantially remain on other portions of said top layer.

38. The process of claim 37, wherein said first photoresist material consists essentially of PMMA (polymethylmethacrylate).

39. The process of claim 37, wherein said step of developing said second photoresist material also removes exposed portions of said anti-reflective material.

40. The process of claim 37, wherein said anti-reflective coating does not react with said first or second photoresist materials to form an insoluble or opaque additional layer.

41. The process of claim 37, wherein said anti-reflective coating is adherent to said first photoresist material, and said second photoresist material is adherent to said anti-reflective coating.

42. The process of claim 37, wherein said first and second photoresist materials have respective compositions such that said second photoresist material can be developed in a solvent which will not erode said first photoresist material.

43. The process of claim 37, wherein said first and second photoresist materials have respective compositions such that said first photoresist material can be developed in a solvent which will not erode said second photoresist material.

44. The process of claim 37, wherein said first photoresist material is deposited to a minimum thickness in the range between 1.5 and 5 microns.

45. The process of claim 44, wherein said second photoresist material is deposited to a substantially uniform thickness of less than 1.1 micron.

46. The process of claim 44, further comprising the additional step, before deposition of said anti-reflective coating, of baking said first photoresist material at a low temperature, whereby said first photoresist material is further planarized.

47. An integrated circuit selective ion implantation process comprising the steps of:
    providing a substrate having partially formed integrated circuit structures on the top surface thereof:
    depositing a first photoresist material over the top surface of said substrate, said first photoresist material being deposited to provide a substantially planar surface;
    depositing an anti-reflective coating over said first photoresist material; and
    depositing a second photoresist material over said anti-reflective material;
    wherein said first photoresist material is photosensitive at a first wavelength to which said second photoresist material is opaque,
    and wherein said anti-reflective material is opaque at a second wavelength to which said second photoresist layer is sensitive;
    exposing said second photoresist material to patterned optical illumination at said second wavelength in a predetermined pattern;
    developing said second photoresist material, so that said second photoresist material is removed in areas determined by said predetermined pattern;

illuminating said first photoresist material at said first wavelength;

developing said first photoresist; and implanting a desired dose of at least one predetermined ion species at a predetermined energy, whereby said desired dose is at least partially stopped by remaining portions of said photoresist materials to provide patterned ion implantation.

48. The process of claim 47, further comprising the subsequent step of driving in said implanted ions.

49. The process of claim 47, wherein said anti-reflective coating is adherent to said first photoresist material, and said second photoresist material is adherent to said anti-reflective coating.

50. The process of claim 47, wherein said first and second photoresist materials have respective compositions such that said second photoresist material can be developed in a solvent which will not erode said first photoresist material.

51. The process of claim 47, wherein said first and second photoresist materials have respective compositions such that said first photoresist material can be developed in a solvent which will not erode said second photoresist material.

52. The process of claim 47, wherein said first and second photoresist materials have respective compositions such that said first photoresist material can be developed in a solvent which will not erode said second photoresist material.

53. The process of claim 47, wherein said first wavelength comprises a wavelength shorter than 265 nm.

54. The process of claim 47, wherein said second wavelength comprises a wavelength longer than 300 nm.

55. The process of claim 47, wherein said anti-reflective coating is deposited to a substantially uniform thickness between 1000 and 2000 Angstroms.

56. The process of claim 47, wherein said first photoresist material is deposited to a minimum thickness in the range between 0.75 and 5 microns.

57. The process of claim 47, wherein said second photoresist material is deposited to a substantially uniform thickness of less than 0.7 micron.

58. An integrated circuit metallization process comprising the steps of:

providing a substrate having partially formed integrated circuit structures on the top surface thereof;

etching contact holes in predetermined locations;

depositing a thin film of a metal overall on said top surface;

depositing a first photoresist material over said metal film, said first photoresist material being deposited to provide a substantially planar surface;

depositing an anti-reflective coating over said first photoresist material; and depositing a second photoresist material over said anti-reflective material;

wherein said first photoresist material is photosensitive at a first wavelength to which said second photoresist material is opaque, and wherein said anti-reflective material is opaque at a second wavelength to which said second photoresist layer is sensitive;

exposing said second photoresist material to patterned optical illumination at said second wavelength in a predetermined pattern;

developing said second photoresist material, so that said second photoresist material is removed in areas determined by said predetermined pattern;

illuminating said first photoresist material at said first wavelength;

developing said first photoresist; and exposing said integrated circuit structure to a predetermined metal etchant plasma, whereby portions of said metal film exposed by said first photoresist layer are etched and portions of said metal film which are overlaid by remaining portions of said first photoresist layer are not substantially etched.

59. The process of claim 58, wherein said first photoresist material is resistant to said predetermined metal etchant.

60. The process of claim 58, wherein said second photoresist material is resistant to said predetermined metal etchant.

61. The process of claim 58, further comprising the subsequent step, after said metal etching step, of removing all remaining portions of said photoresist materials.

* * * * *